(12) United States Patent
Paik et al.

(10) Patent No.: US 7,446,384 B2
(45) Date of Patent: Nov. 4, 2008

(54) CMOS IMAGE SENSOR MODULE WITH WAFERS

(75) Inventors: Kyung-Wook Paik, Daejeon (KR); Myung-Jin Yim, Daejeon (KR); Ho-Young Son, Daegu (KR); Yong-Min Kwon, Gyeonggi-Do (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 11/395,157

(22) Filed: Apr. 3, 2006

(65) Prior Publication Data

US 2006/0252246 A1 Nov. 9, 2006

(30) Foreign Application Priority Data

Apr. 6, 2005 (KR) .................. 10-2005-0028649

(51) Int. Cl.
*H01L 27/14* (2006.01)
*H01L 31/00* (2006.01)
(52) U.S. Cl. .................. 257/431; 257/432; 257/434; 257/734; 257/778; 257/780
(58) Field of Classification Search ......... 257/432–434, 257/734, 737, 778, 779, 780
See application file for complete search history.

(56) References Cited

U.S. PATENT DOCUMENTS 6,737,292 B2 * 5/2004 Seo .................. 438/64

(Continued)

FOREIGN PATENT DOCUMENTS

JP 410154726 * 6/1998

(Continued)

OTHER PUBLICATIONS

Charles A. Harper, Electronic Packaging and Interconnection Handbook, 2000, pp. 1.11, 1.12 and 1.36.*
Charles A. Harper, Electronic Packaging and Interconnection Handbook, 2000, pp. 1.28-1.30.*

(Continued)

*Primary Examiner*—Monica Lewis
(74) *Attorney, Agent, or Firm*—Baker & Hostetler LLP

(57) ABSTRACT

The present invention relates to an image sensor module and a manufacturing method thereof, especially to a wafer level chip size package (WL-CSP) realized by directly contacting an image sensor chip wafer to a glass wafer on which an IR filter coating layer is deposited, an electrode rearrangement and a dicing process, a miniaturized image sensor module using this wafer level chip size package (WL-CSP) and a method thereof. The CMOS image sensor module using a wafer level chip size package technology according to the present invention comprises: an image sensor chip wafer having a partition with a lattice structure formed at portions except an image sensing area; and a glass wafer with an IR filter coating layer and a metal electrode; and wherein the image sensor chip wafer and the glass wafer form an electric contact and a chip sealing by a flip-chip bonding; and wherein a solder bump and a non solder bump are formed after a metal wiring is rearranged on a lower surface of the glass wafer. According to the present invention, it is possible to realize a cheap wafer level chip size package (WL-CSP) using the existing wafer processing and the metal deposition processing equipments. Further, an image sensor module with smaller thickness and area than the existing CSP package can be realized. Moreover, an image sensor module with a smaller area than the existing COG package can be realized.

9 Claims, 15 Drawing Sheets

U.S. PATENT DOCUMENTS

| | | | | |
|---|---|---|---|---|
| 7,087,464 B2 * | 8/2006 | Yu et al. | ................... | 438/113 |
| 7,221,051 B2 * | 5/2007 | Ono et al. | ................... | 257/704 |
| 2005/0051859 A1 * | 3/2005 | Hoffman | ................... | 257/434 |

FOREIGN PATENT DOCUMENTS

| | | |
|---|---|---|
| KR | 10-2006-0016413 | 2/2006 |

* cited by examiner

CMOS IMAGE SENSOR MODULE WITH WAFERS

CROSS-REFERENCE TO RELATED APPLICATIONS

This application claims priority to Korean Patent Application No. KR 10-2005-0028649, filed Apr. 6, 2005, all of the disclosure of which is hereby incorporated by reference in its entirety.

FIELD OF THE INVENTION

The present invention relates to an image sensor module and a manufacturing method thereof, especially to a wafer level chip size package realized by directly contacting an image sensor chip wafer to a glass wafer on which an IR filter coating layer is deposited, an electrode rearrangement and a dicing process, a miniaturized image sensor module using this wafer level chip size package and a method thereof.

An image sensor is a device transforming a light into an electric signal capable of being applied in various fields of our daily lives. The image sensors are classified into a light receiving unit for generating as many charges as a light receive and a circuit unit for transforming the charges into a final type through voltage, and into a CCD image sensor and a CMOS image sensor in accordance with its method. In the case of a CCD sensor, charges generated from the light receiving unit are moved into an output terminal at a gate voltage and transformed into an electric signal at the final terminal, while in the case of a CMOS sensor, charges are transformed into electric signals (voltages) in all pixel units to be transmitted to the final terminal. Accordingly, the CMOS image sensor has CMOS switching circuits per pixel contrary to the CCD sensor, and has ADC inside in many cases, therefore, it has a big difference in image quality in comparison with the CCD sensor at its earlier times due to a photon shot noise from the circuits around a pixel array, a noise at the light receiving unit itself and other various noises caused by the CMOS circuit. In accordance with the developments of a foundry industry, a process technology, a pixel design technology and a noise decreasing design technology, a medium or a low level specification image quality can be obtained. When comparing to the CCD image sensor, the CMOS image sensor can be highly integrated because it uses a low voltage in the range of 3.3V to 1.8V and specific circuits including a sensor function can be included in one chip in the existing CMOS manufacturing process. In addition, if a CMOS image sensor is used in designing a system, it is possible to decrease the number of particles and a system cost because of its highly integrated characteristics and a low production cost.

BACKGROUND OF THE INVENTION

For the past 20 years, a CCD image sensor has monopolized an image sensor market, but it is predicted that a CMOS image sensor market remarkably grows to exceed a CCD image sensor in an amount and the sales in a mobile field requiring for a low electric power consumption. Especially, a rapidly increasing number of CMOS image sensors are used in the specified fields requiring for a high function and a high integration, a high speed/high pixel characteristic and so on. The major markets of this field include a mobile phone, a digital steel camera, an optical mouse, a surveillance camera, biometrics and so on.

A CMOS image sensor is manufactured into a CMOS image sensor module from a CMOS image sensor chip by an electronic package technology. And it is applied into various goods and a package specification required by the CMOS image sensor module depends on characteristics of the finished goods. Especially, the recent tendencies of a CMOS image sensor module, namely, high electricity capabilities, miniaturization/high density, a low power consumption, multifunction, a high speed signal processing, a reliability are the representative characteristics of a miniaturization of the electronic goods.

Contrary to general CMOS chips, the CMOS image sensor in the past is feasible to a physical environment and can be polluted by the impurities, and a leadless chip carrier LCC type package is used when its size is not considered to be important. However, in a recent tendency of a market requiring for thin and simplified characteristics such as in a camera phone, chip-on-board (COB), chip-on-film (COF), chip size package (CSP), etc. are generally used.

FIG. 1 is a perspective view showing the structure of an image sensor module using a COB method and a COF method of an image sensor.

In the COB method, a flexible PCB 103 is adhered to a rear surface of an image sensor chip 101 by a die paste, and input/output (I/O) terminals of an image sensor chip 101 is connected with the PCB electrode by a gold bonding wire 102. The method is advantageous in that a productivity is improved in a process similar to the existing semiconductor production line but disadvantageous in that the size of a module is increased because a space for wire bonding is required. In the COB method, a flexible PCB is directly adhered to an image sensor chip 101, but in the COF method, an active side of an image sensor chip 101 is directly flip-chip bonded to an electrode of a flexible PCB or a flexible printed circuit (FPC). Therefore, a gold bonding wire 102 is not required contrary to the COB method and the height of a body tube is lowered to manufacture a thin and short module. At this time, an anisotropic conductive film (ACF) is primarily used to attach an image sensor to a flexible PCB or FPC, and a gold plating bump or an electroless nickel/gold bump are used for a bump formed on input/output (I/O) terminals of the image sensor chip 101. In addition, the flexible PCB or FPC has a perforated portion as wide as a sensing portion in order to transmit a light into a front portion of an image sensor.

FIG. 2 is a perspective view showing a CSP package structure for an image sensor module developed by Shellcase Inc. of Israel.

In order to realize a thin and short chip package of an image sensor, a chip size package technology is developed. As shown in FIG. 2, the CSP method of which the original patent is owned by Shellcase Inc. of Israel has an image sensor chip 201 mounted on a lower glass substrate 205, an empty space between an image sensing portion and an upper glass substrate 202, of which peripheral portions are adhered by epoxy resin to form an electric wiring at a rear surface of a substrate glass from input/output (I/O) and a solder bump 204 is finally formed. A wafer level process can be performed in order to simplify the manufacture of a module and the CSP method is helpful to decrease a volume of the module. However, an upper glass substrate 202 and a lower glass substrate 205 are used respectively not enough to further decrease the height of an image sensor module.

FIG. 3 is a perspective view showing the structure of an image sensor module using a COG method in an image sensor.

Recently, a glass for an IR filter is combined with a substrate to develop a package in a Chip-on-Glass (COG) method in an attempt to decrease the size of a module of an image sensor as shown in FIG. 3. In other words, an electrode and a wiring are formed on a glass substrate 303 having the shape of a wafer, a solder bump 301 for the second connection is adhered to the glass substrate 303 and an image sensor chip 302 where a solder bump is formed at the input/output (I/O) terminals is flip-chip bonded to the glass substrate 303 and the glass substrate 303 having the image sensor chip 302 is diced to manufacture an image sensor module. The image sensor module manufactured in this method is advantageous in that the thickness can be minimized but is disadvantageous in that the width is increased because a wider glass module substrate than an image sensor chip is used. In a strict meaning, it cannot be called a wafer level package because a separate chip contacts a glass wafer substrate.

SUMMARY OF THE INVENTION

In order to solve the above problems, an object of the present invention is to provide with an image sensor module having the minimum thickness and area by using a glass coated with an IR filter, having the same size as the image sensor chip in a wafer level chip size package method by a direct boding between a wafer where an image sensor chip is processed and a glass substrate wafer.

In order to achieve the above object, there is provided with a CMOS image sensor module using a wafer level chip size package technology, comprising: an image sensor chip wafer with a partition with a lattice structure formed at portions except an image sensing area; and a glass wafer with an IR filter coating layer and a metal electrode; and wherein the image sensor chip wafer and the glass wafer form an electric contact and a chip sealing by a flip-chip bonding; and wherein a solder bump and a non solder bump are formed after a metal wiring is rearranged on a lower surface of the glass wafer.

It is preferable that a non solder bump is formed at input/output terminals of the image sensor chip wafer.

It is preferable that the non solder bump is formed of more than one bump selected from the group consisting of a gold plating bump, an electroless nickel/gold bump, a gold stud bump, a copper stud bump and a copper plating bump.

It is preferable that the partition with a lattice structure is formed of photosensitive polymer materials such as polyimide or Benzocyclobutene.

It is preferable that the height of a partition with a lattice structure is the same as or smaller than that of the non solder bump.

It is preferable that the partition with a lattice structure is formed of an anisotropic conductive film or a non-conducting film.

It is preferable that the metal electrode includes more than one metal selected from the group consisting of Au, Pd, Pt, Ag, Al and Cu.

It is preferable that the metal electrode of the glass wafer forms a flip-chip contact on a surface opposite to the IR filter coating layer to fit to the positions and the arrangements of the non solder bump of the image sensor chip wafer, and is rearranged on a lower surface through a lateral surface of the glass wafer.

It is preferable that a solder bump on an electrode rearranged on a lower surface of the glass wafer is further comprised, and the solder bump is more than one bump selected from the group consisting of Sn, SnAg, SnAgCu, SnAgBi, PbSn and In.

It is preferable that a non solder bump on an electrode rearranged on a lower surface of the glass wafer is further comprised, and the non solder bump is more than one bump selected from the group consisting of an electroless nickel/gold bump, a gold plating bump, a gold stud bump, a copper plating bump and a copper stud bump.

It is preferable that a flip-chip bonding contact of the image sensor chip wafer and the glass wafer is formed of an anisotropic conductive film or a non-conducting film, an anisotropic conductive paste or a non-conducting paste.

It is preferable that the anisotropic conductive film or the non-conducting film is covered on a release paper with an uniform thickness, and is penetrated by the same as or the larger than an internal area of the partition, having the same arrangements as the positions of an internal space of a polymer partition of the image sensor chip wafer.

A method for manufacturing a CMOS image sensor module, comprises: preparing an image sensor chip wafer and a wafer glass on which an IR filter coating layer is formed; forming a non solder bump in the image sensor chip wafer; forming a partition with a lattice structure in an image sensor chip wafer on which the non solder bump is formed; forming a metal electrode and an interconnection on a surface opposite to the IR filter layer surface; processing a contact between an image sensor chip wafer on which the non solder bump and a partition are formed and a glass wafer on which a metal electrode pattern is formed; forming a notch on a surface on which an IR filter layer of a glass wafer contacting the image sensor chip wafer is formed; forming a metal wiring and an electrode on a glass wafer on which the notch is formed; forming a solder ball and a non solder ball on a metal electrode surface of the glass wafer; and dicing a glass wafer contacting the image sensor chip wafer along a valley where a notch is formed.

It is preferable that a process for thinning the thickness of the image sensor chip wafer and a glass wafer on which the IR filter coating layer is formed by a back grinding is further comprised.

It is preferable that a contact bonding of an image sensor chip wafer on which a non solder bump is formed in the polymer partition and a glass substrate wafer on which a metal electrode is formed on a surface opposite to the IR filter coating layer uses an anisotropic conductive film or a non-conducting film, an anisotropic conductive paste or a non-conducting paste.

It is preferable that the anisotropic conductive film or the non-conducting film is subjected on a surface on which a metal electrode of a glass wafer is formed by a lamination method and a release paper film is removed, and the image sensor chip wafer is compression-bonded by applying heat and pressure.

It is preferable that the anisotropic conductive paste or the non-conducting paste is covered on a surface on which a metal electrode of a glass wafer is formed by a stencil printing or a dispensing method, and the image sensor chip wafer is compression-bonded by applying heat and pressure.

It is preferable that the notch is formed on a surface on which an IR filter coating layer of a glass wafer contacting an image sensor chip wafer is formed by a laser cutting or a mechanical sawing method.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE INVENTION

Figure 1A:
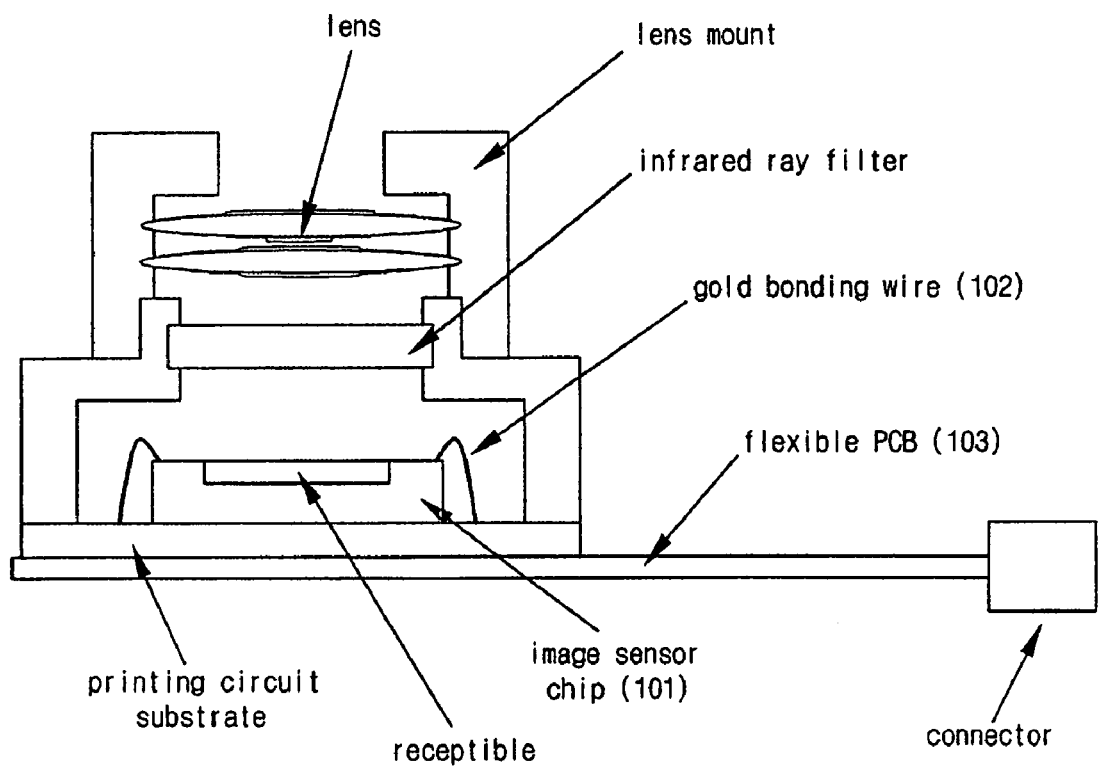
FIG. 1 is a perspective view showing a structure of an image sensor module using a COB method and a COF method of an image sensor.
Figure 1B:
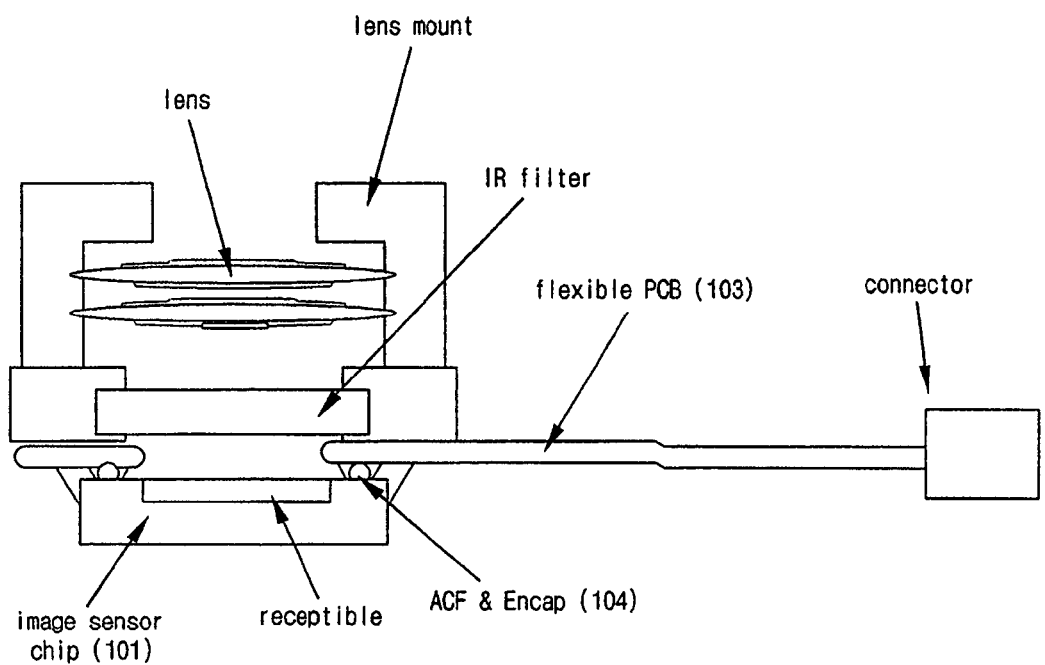
Figure 2:
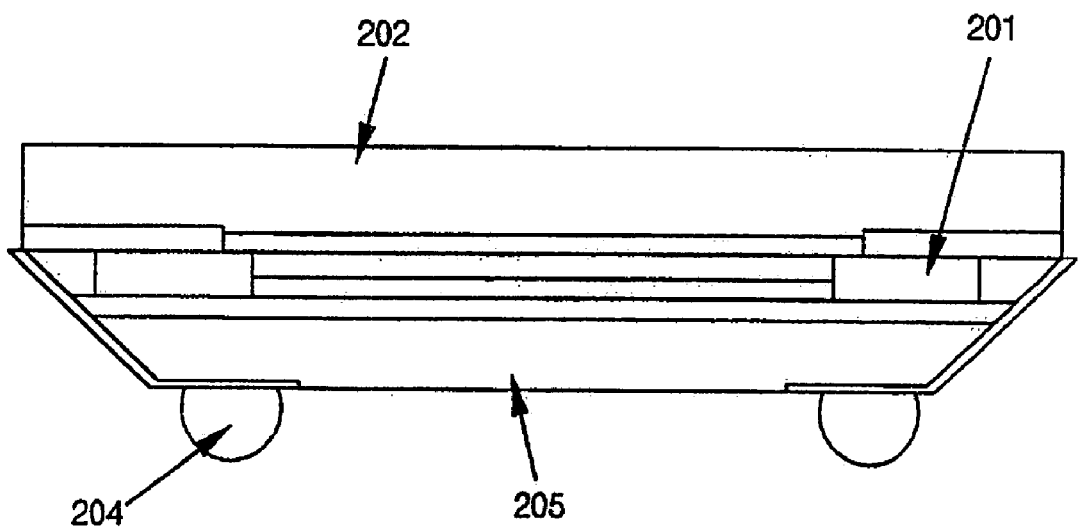
FIG. 2 is a perspective view showing the structure of a CSP package for an image sensor module developed by Shellcase Inc. of Israel.
Figure 3:
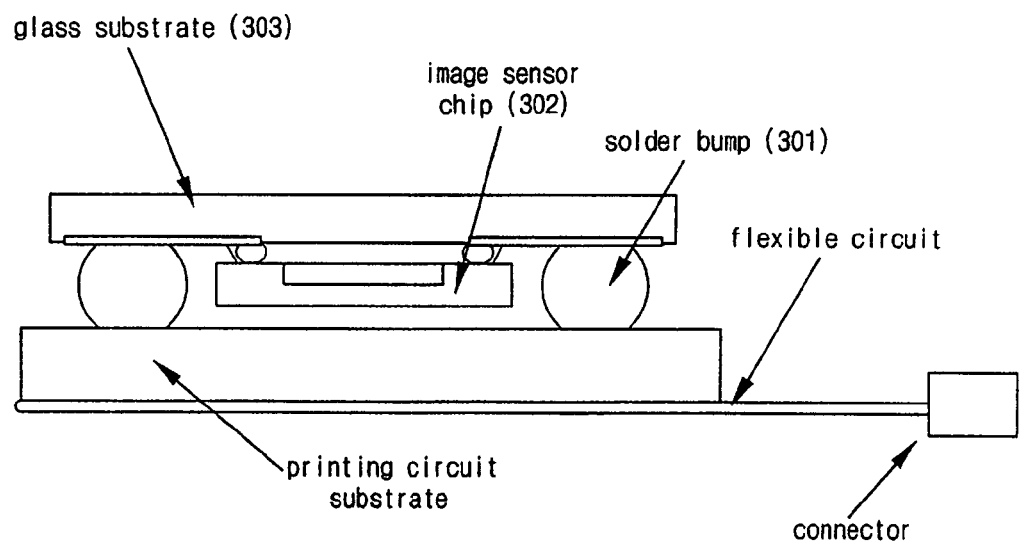
FIG. 3 is a perspective view showing the structure of an image sensor module using a COG method of an image sensor.

The present invention now will be described in detail with reference to the following embodiments hereinafter. In the drawings, the same reference numerals denote the same components. The detailed descriptions of the well-known functions and the constructions which are determined to make the spirit of the present invention unclear will be omitted.

Preparing an image sensor chip wafer and a glass wafer on which an IR filter coating layer is formed.

Figure 4:
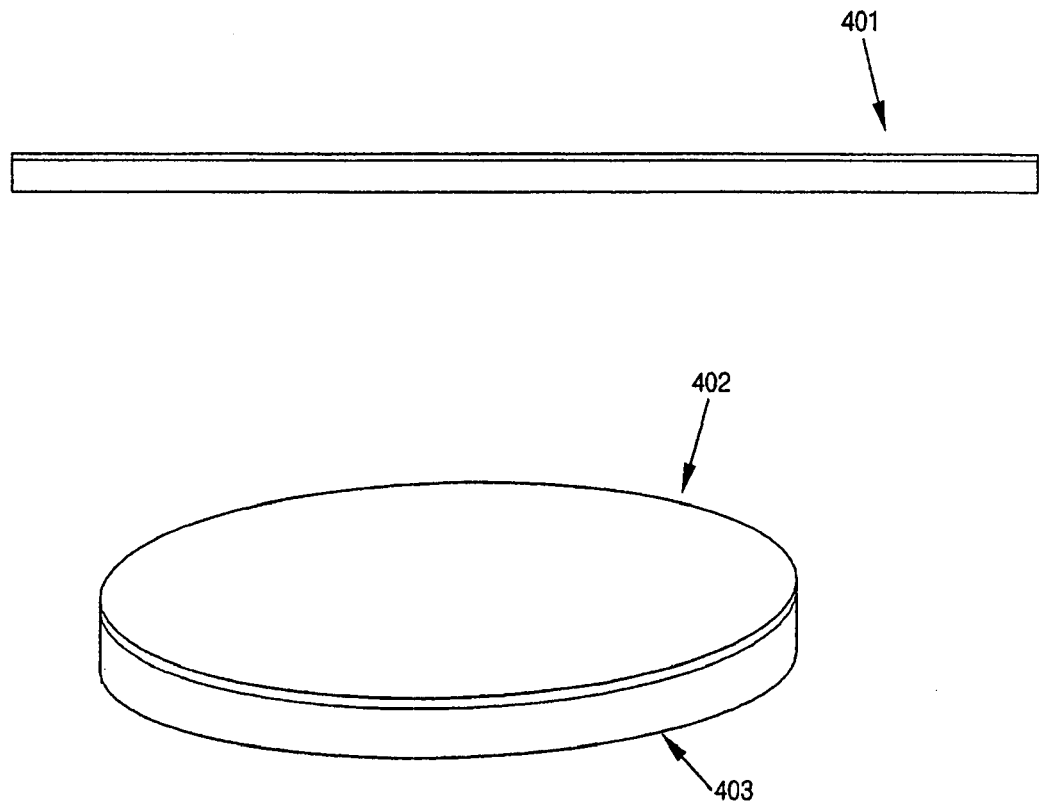
FIG. 4 shows an image sensor chip wafer required for manufacturing an image sensor module using a wafer level chip size package (WL-CSP) and a wafer glass on which an IR filter coating layer is formed in accordance with an embodiment of the present invention.

FIG. 4 shows an image sensor chip wafer required for manufacturing an image sensor module using a wafer level chip size package (WL-CSP) technology and a wafer glass on which an IR filter coating layer is formed in accordance with the present invention. At this time, the image sensor chip wafer 401 may have the same size as a glass wafer 403 on which an IR filter coating layer 402 is formed with 4, 6, 8 or 10 inches. In addition, the image sensor chip wafer 401 and the glass wafer 403 may be thinned by a wafer thinning process.

Forming a non solder bump on input/output (I/O) of separate chips in an image sensor chip wafer.

Figure 5:
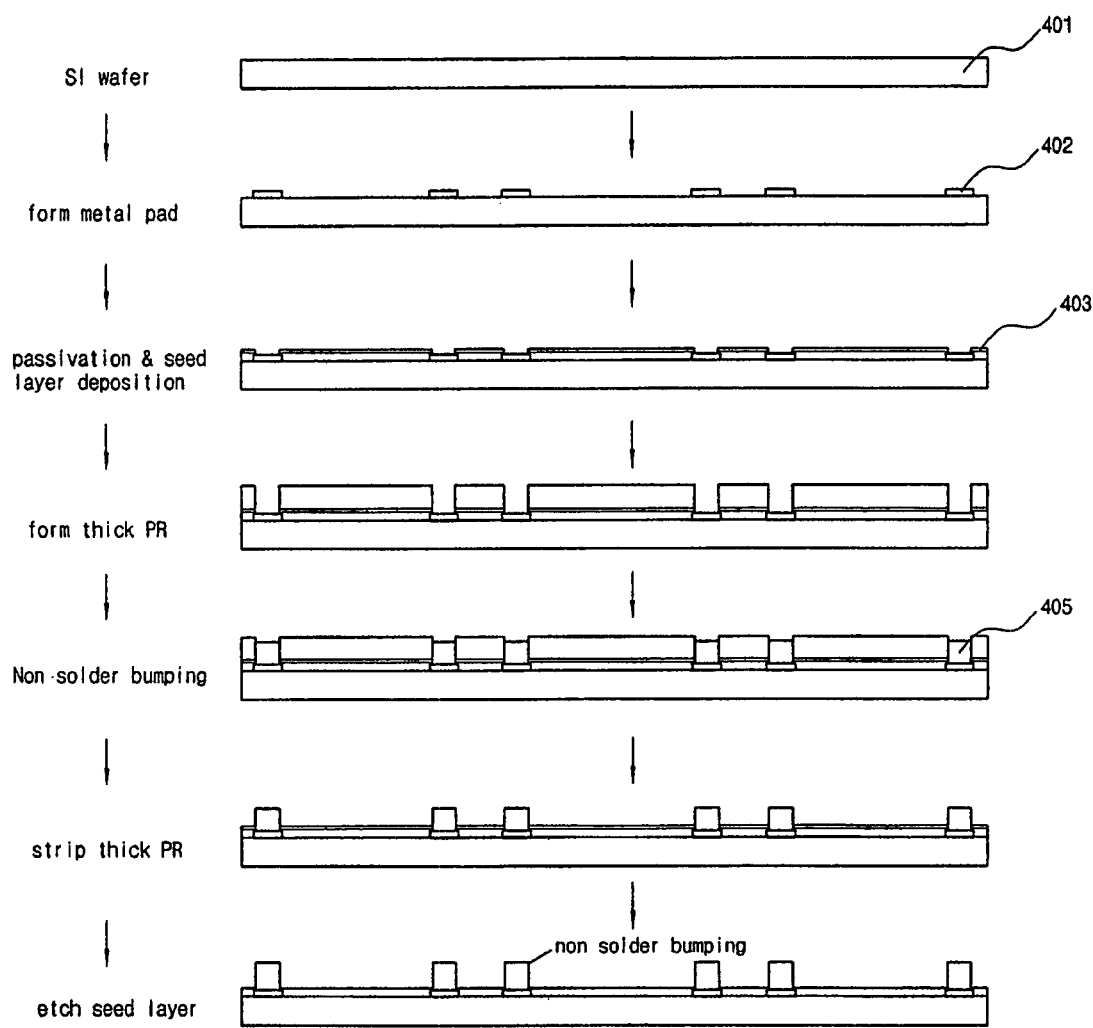
FIG. 5 shows a process step for forming non solder bump in an image sensor chip wafer in accordance with an embodiment of the present invention.

FIG. 5 shows a process for forming a non solder bump in an image sensor chip wafer according to the present invention.

Referring to FIG. 5, an electroless nickel/gold plating bump, a gold stud bump and a gold plating bump are formed so as to form a non solder bump 405 on I/O of each chip of the image sensor wafer 401. A wafer manufactured by a process for manufacturing a semiconductor using a general Al metallization has Al input/output (I/O). If a non solder bump 405 formed in the image sensor chip wafer 401 is a gold stud bump, a gold bonding wire bonder is used to form a gold bump. A mechanic stud bump with a diameter of 80 μm and a height of 60 μm is directly formed on input/output (I/O) of a separate chip in an image sensor wafer. Since one stud is formed per one input/output (I/O) but a chemical process and a mask process are not used in spite of a long lasting time per a wafer, it is possible to form a cheap non solder bump. In a case of an electroless nickel/gold plating, a zincate process should be used to activate the Al surface with Zn before a nickel plating. The nickel plating makes a bump to have the height of 15 to 20 μm by the nickel plating for 20 to 30 minutes at 90° C., and the gold plating prevents a nickel from being oxidized by the plating for 30 minutes at 60° C. In the case of a gold plating bump, a gold seed layer is formed on a front surface of an image sensor chip wafer 401 and a photoresist is covered to open a portion where a bump is to be formed using a lithography process. A gold bump with the height of 20 μm is formed using a gold electric plating method.

Forming a partition with a lattice structure

Figure 6:
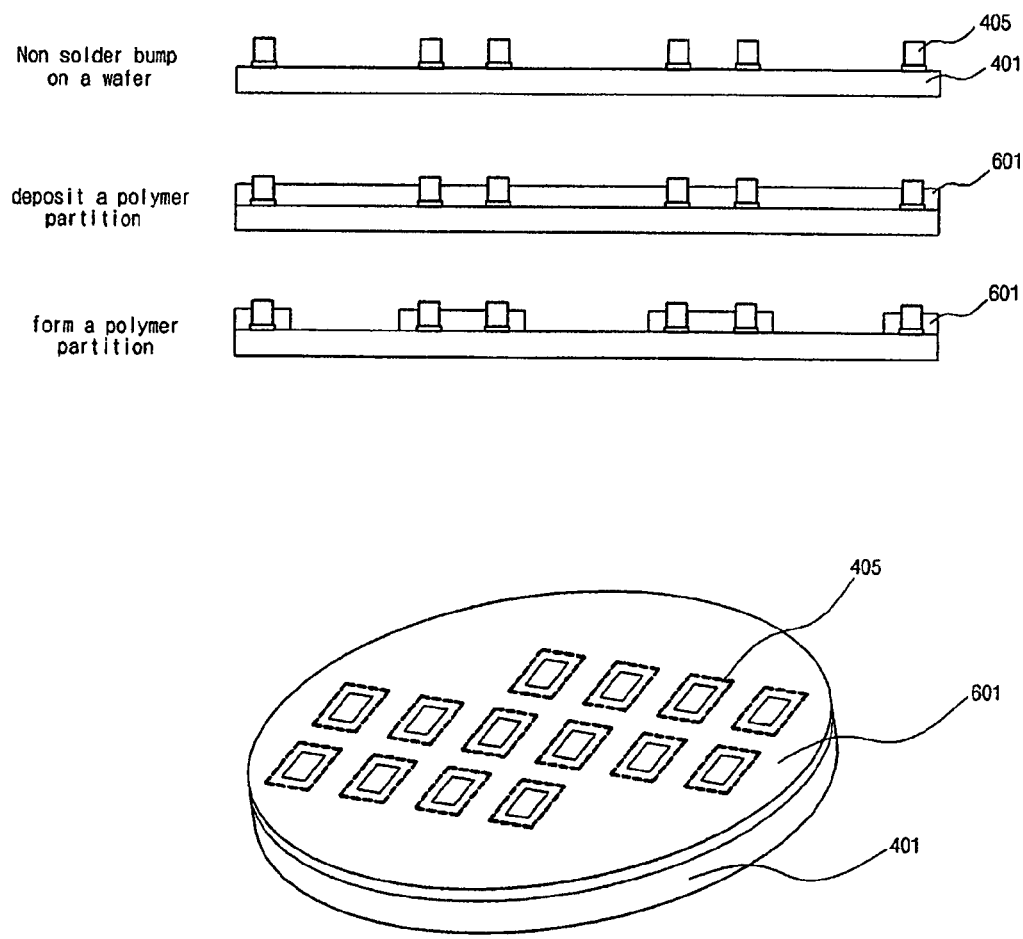
FIG. 6 shows a process step for forming a partition with a lattice structure in an image sensor chip wafer where a Non solder bump is formed in accordance with an embodiment of the present invention.

FIG. 6 shows a process for forming a partition with a lattice structure in an image sensor chip wafer on which a non solder bump is formed in accordance with the present invention.

Referring to FIG. 6, a partition 601 with a lattice structure is formed on an image sensor wafer on which a non solder bump 405 is formed at I/O. This is to realize a kind of hermetic package for protecting an image sensing area in an image sensor chip wafer 401 after the wafer level chip size package (WL-CSP) is formed. In order to form a partition 601 with a lattice structure on the image sensor chip wafer 401, photosensitive polymer materials such as polyimide and BCB are used.

The image sensor chip wafer 401 on which a non solder bump 405 is formed is coated by a spin coating process to expose an image sensing area of the image sensor chip wafer 401 for forming a partition structure using a mask and a lithography. At this time, the partition of polymer materials is formed to be 7 to 10 µm lower than the height of a non solder bump. The partition lattice structure may sometimes be omitted.

Forming a metal electrode and a wiring on a glass wafer surface opposite to an IR filter coating layer surface.

Figure 7:
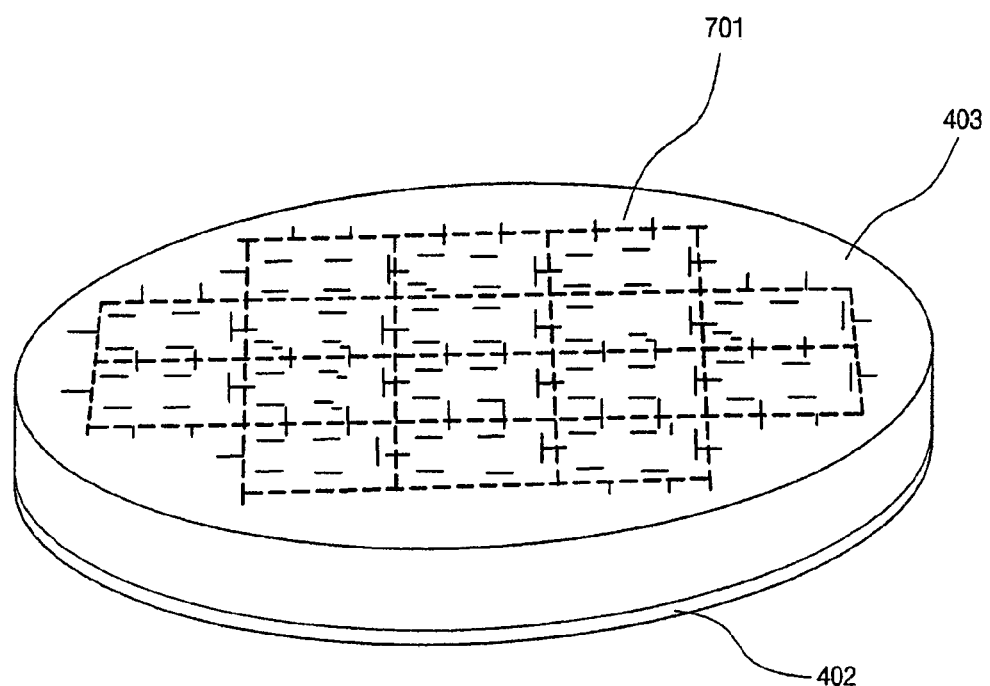
FIG. 7 shows a process step for forming a metal electrode on a surface opposite to an IR filter coating layer surface and a wiring in accordance with an embodiment of the present invention.

FIG. 7 shows a process for forming a metal electrode and a wiring on a glass wafer surface opposite to an IR filter coating layer surface in accordance with the present invention.

Referring to FIG. 7, a metal electrode 701 and a wiring are formed on a glass wafer surface opposite to an IR filter coating layer surface 402. The process for forming the metal electrode 701 and a wiring employs a general metal deposition and a lithography. In other words, an adhesion layer for strengthening an adhesive force between a glass wafer 403 and metals, an electrode and a wiring layer are deposited on a front surface of the glass wafer 403 to form an electrode and a wiring by the processes of a photoresist coating, an exposure and an etching. The electrode position and area, and a wiring structure are designed in accordance with an input/output (I/O) area of an image sensor chip and its arrangements.

Processing for an interface between an image sensor chip wafer on which a non solder bump and a partition are formed and a glass wafer on which a metal electrode pattern is formed.

Figure 8:
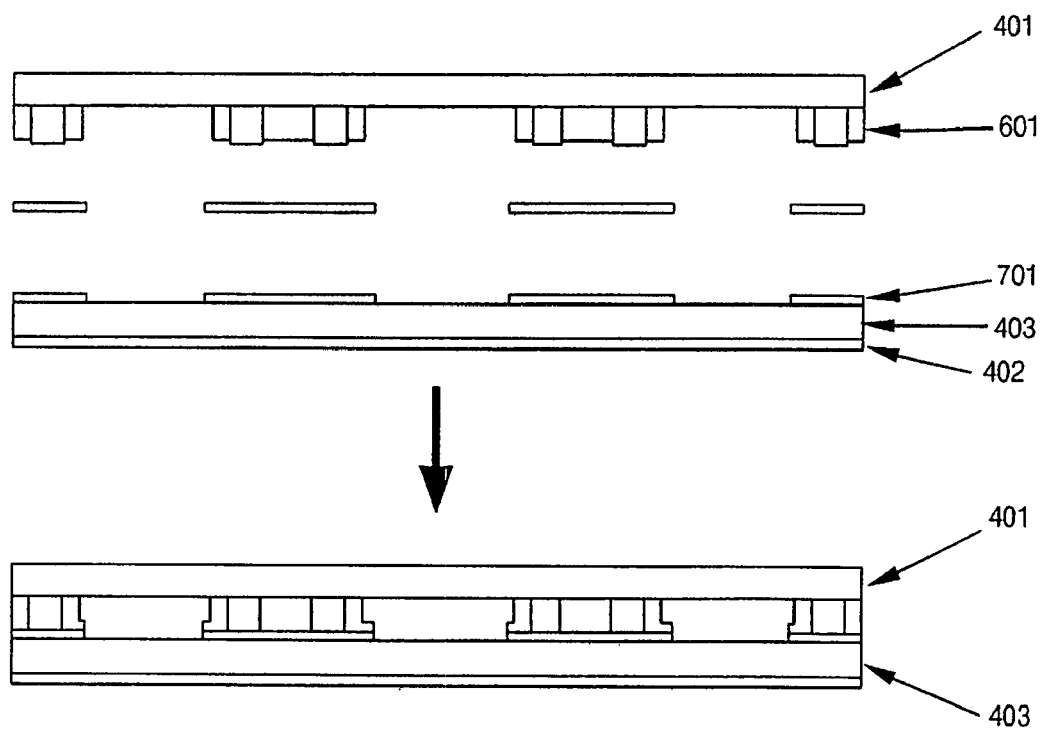
FIG. 8 shows a process step of a contact between an image sensor chip wafer where a non solder bump and a partition are formed and a glass wafer where a metal electrode pattern is formed in accordance with an embodiment of the present invention.

FIG. 8 shows a process for an interface between an image sensor chip wafer on which a non solder bump and a partition are formed and a glass wafer on which a metal electrode pattern is formed.

An anisotropic conductive film (ACF) is used as an interfacial material, which plays a role as an electric interface between a non solder bump 405 protruded in a partition 601 formed on an image sensor chip wafer 401 and an electrode of a glass wafer 403, an adhesive layer between an image sensor chip wafer 401 and a glass wafer 403 and a hermetic sealing between a sensor chip in a separate image sensor module and a glass substrate.

An anisotropic conductive film (ACF) for bonding between an image sensor chip wafer 401 and a glass wafer 403 on which an IR filter coating layer 402 is formed to have a wafer size sheet. If a partition with a lattice structure is formed in the image sensor chip wafer 401, it is covered with the thickness of 7 to 10 µm on a release film with a thickness of 50 µm. In addition, if a non solder bump 405 is formed, excluding a partition with a lattice structure on the image sensor chip wafer 401, it is covered with the thickness of 25 to 40 µm on a release film. In this case, the anisotropic conductive film ACF performs roles as a partition with a lattice structure, a connecting material and an adhesion layer at the time of bonding.

After an anisotropic conductive film (ACF) having the same partition structure as the image sensor chip wafer 401 is formed for bonding between an image sensor chip wafer 401 and a glass wafer 403, a punching process for removing the ACF layer as wide as or wider than the internal width of the image sensing area with the lattice structure is performed in order to protect the image sensing area. After manufacturing a wafer-sized ACF, and removing the ACF layer to be fit for the size of an image sensing area and its arrangements in the image sensor chip of the image sensor chip wafer 401, the image sensor chip wafer 401 is pseudo-pressured on a glass wafer 403 on which a metal electrode and a wiring are formed to remove a release film. The pseudo-pressure process is performed for 1 to 10 seconds under the pressure of 0.1 to 2 MPa at 80° C. to remove a release film. Next, a thermocompression is performed for a contact between the image sensor chip wafer 401 and the glass wafer 403 substrate on which an anisotropic conductive film ACF is pseudo-pressured. The thermocompression is performed under a bonding condition of a pressure of 30~150 MPa at 180~220° C. for 3 to 20 seconds, in consideration of the characteristics of the image sensor chip wafer 401 and the glass wafer 403.

A mixture of epoxy resin mixed with a gold-coated polymer ball of 5~10 wt %, solvent and imidazole series sclerotic of 7~10 g per epoxy of 100 g forms a film on a larger release film than a wafer by a doctor blading method to remove a solvent at 80° C. for 1~2 minutes using an oven to finally manufacture an anisotropic conductive film ACF in a type appropriate for a wafer level package of an image sensor chip having a partition with a lattice structure.

Forming a V-shaped notch on the surface on which an IR filter layer is formed, the surface of a glass wafer contacting an image sensor chip wafer.

Figure 9:
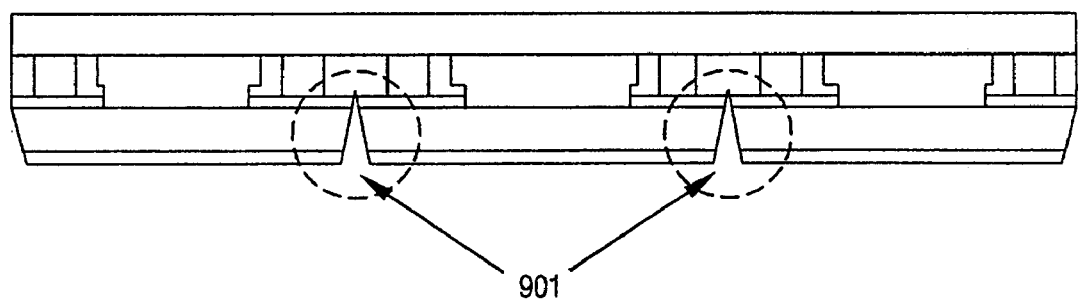
FIG. 9 shows a process for forming a V-shaped notch on a surface having an IR coating layer, of a glass wafer contacting an image sensor chip wafer in accordance with an embodiment of the present invention.

FIG. 9 shows a step for forming a V-shaped notch on the surface on which an IR filter layer is formed, the surface of a glass wafer contacting an image sensor chip wafer according to the present invention. The V-shaped notch 901 is performed on a basis of a dicing line between an image sensor chip wafer 401 and a chip so that an end of the notch 901 formed from the glass wafer 403 is in the space between an image sensor chip wafer surface toward the glass wafer 403 and a metal electrode surface of the glass wafer surface 403. Accordingly, a metal wiring on a glass wafer surface is formed to connect with the outside in the structure of a notch due to the formation of a V-shaped notch 901. The V-shaped notch 901 is formed usually by a mechanical method using a wafer dicing device.

Forming a metal wiring and an electrode on a glass wafer on which a notch is formed.

Figure 10:
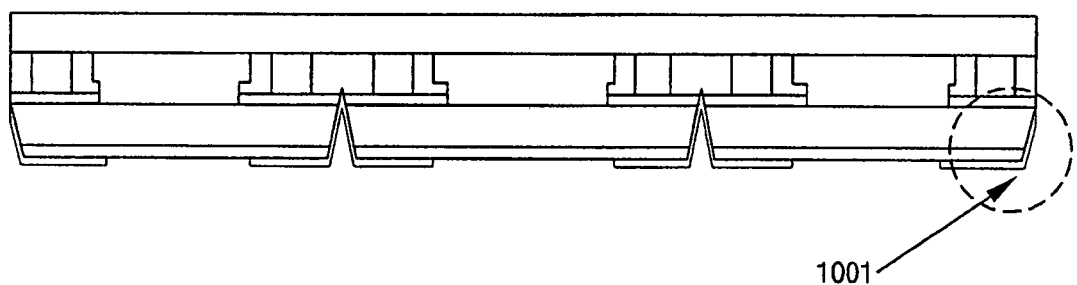
FIG. 10 shows a process for forming a metal wiring and an electrode in order to rearrange the metal wiring exposed through the V-shaped notch formed on a lower surface of a glass wafer toward a lower surface of a glass substrate in accordance with an embodiment of the present invention.

FIG. 10 shows a process for forming a metal wiring and an electrode to rearrange a metal wiring exposed through the V-shaped notch formed on a lower surface of a glass wafer onto the lower surface of a glass substrate. A metal wiring is formed in the V-shaped notch on a glass wafer surface from a non solder bump of an image sensor chip wafer through an upper electrode of a glass wafer to form a wiring structure of a lower electrode of the glass wafer. At this time, the processes of a Ti/Au sputter or an evaporator are used for depositing a metal layer, an electric metal wiring layer is drawn from an upper electrode of a glass wafer to form a lower electrode on a lower surface of the glass wafer using a lithography method. The V-notch portion is formed to an adhesive layer and a lattice structural layer through an upper electrode wiring layer, therefore it is possible to electrically connect an upper wiring of a glass wafer with a notch line. In addition, a suitable under bump metallurgy UBM is deposited for forming a solder ball 1001.

Forming a solder ball and a non solder ball

Figure 11:
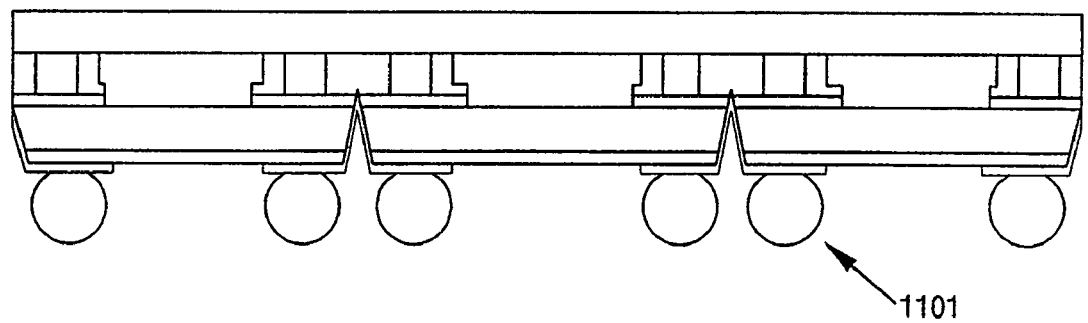
FIG. 11 shows a process step for forming a solder ball and a non solder ball on a metal electrode surface of a glass wafer in accordance with an embodiment of the present invention.

FIG. 11 shows a process for forming a solder ball and a non solder ball on a metal electrode surface of a glass wafer according to the present invention.

Referring to FIG. 11, a solder bump and/or a non solder bump 1101 for contacting the second substrate to an electrode formed on a lower surface of a glass wafer contacting an image sensor chip wafer. Solder is reflowed to form a solder ball by a screen printing method but a non solder bump forms an Au stud bump.

The solder bump uses more than one bump selected from the group consisting of Sn, SnAg, SnAgCu, SnAgBi, PbSn and In, while it is preferable that the non solder bump uses more than one bump selected from the group consisting of an electroless nickel/gold bump, a gold plating bump, a gold stud bump, a copper stud bump and a copper plating bump.

Dicing a glass wafer and an adhered image sensor chip wafer along a valley where a notch is formed.

Figure 12:
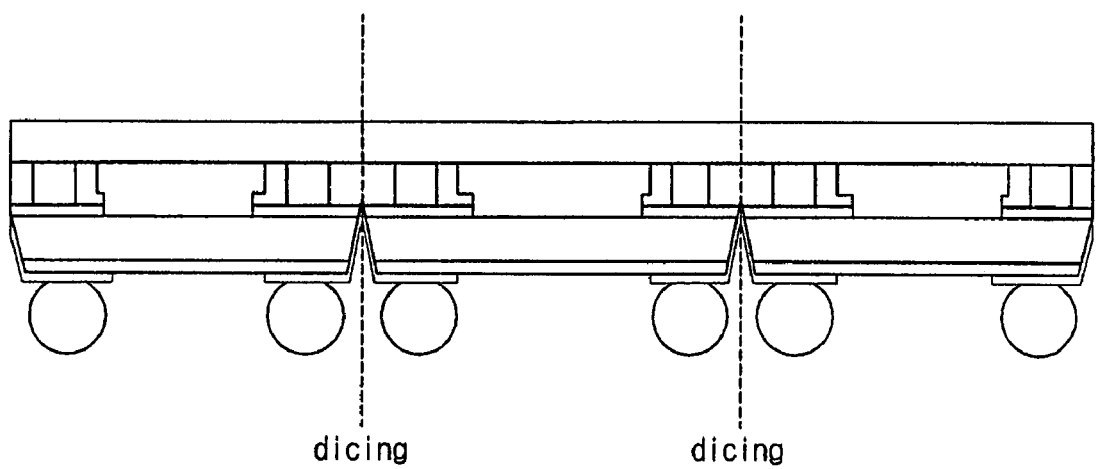
FIG. 12 shows a step for dicing an image sensor chip wafer attached on the glass wafer along a valley where a notch is formed in accordance with an embodiment of the present invention.
Figure 13A:
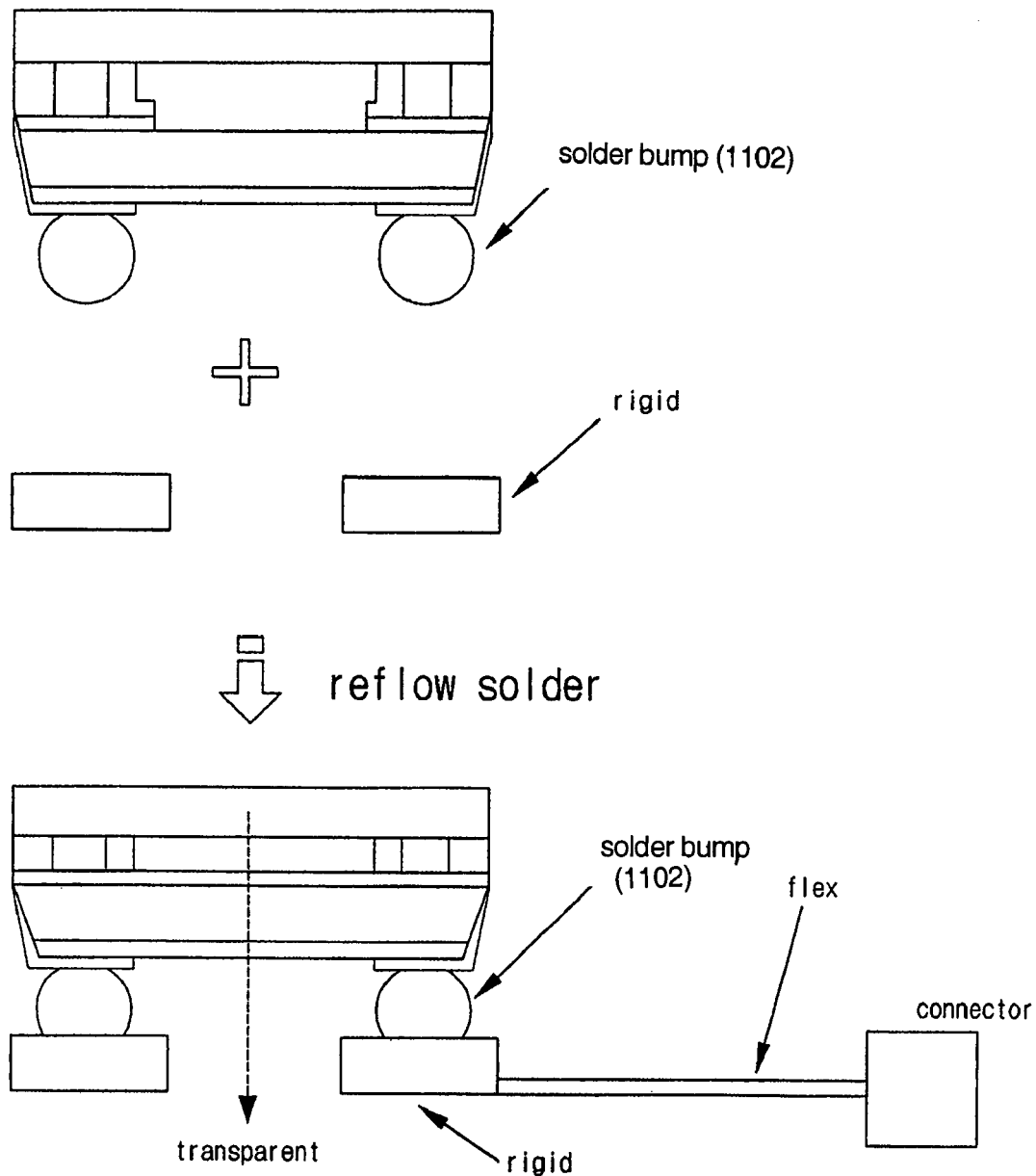
FIG. 13a shows a COB assembly process for reflowing solder on a rigid PCB substrate of an image sensor module where a solder ball is attached and FIG. 13b shows a COF assembly process using an ACF on a flexible substrate of an image sensor module where a non solder bump is formed in accordance with an embodiment of the present invention.
Figure 13B:
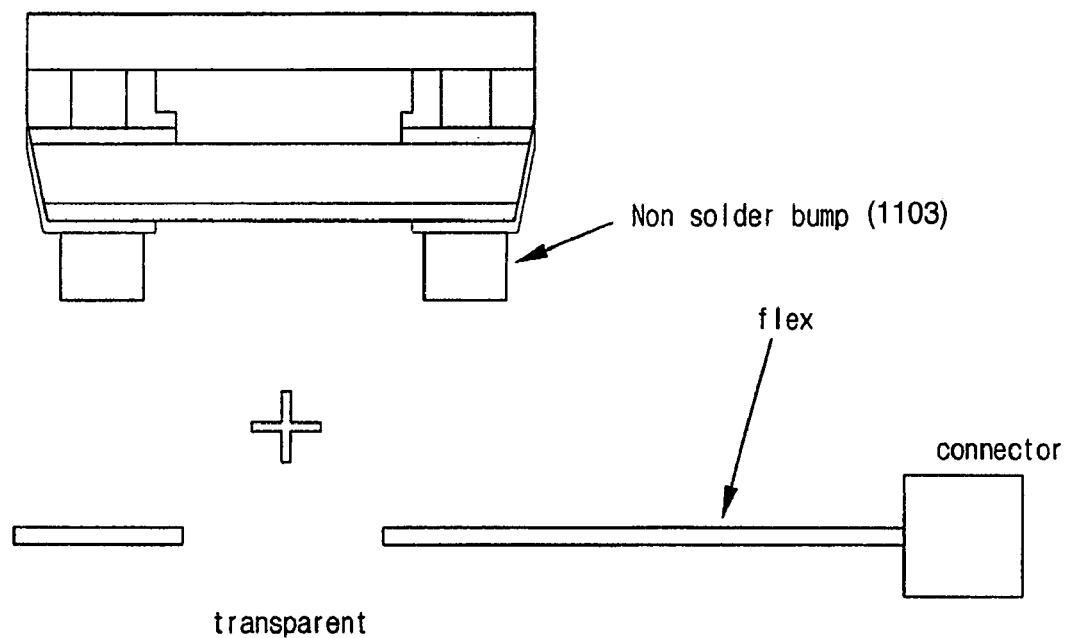
Figure 13B:
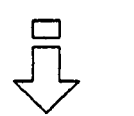
Figure 13B:
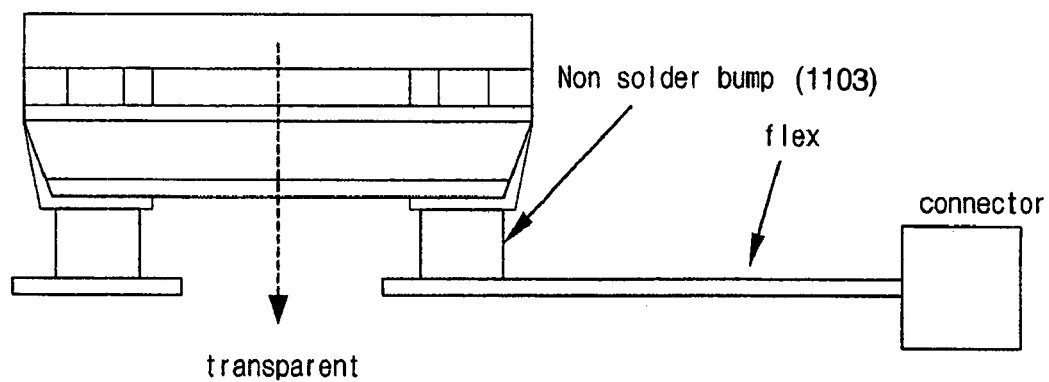

FIG. 12 shows a process for dicing a silicon/glass wafer along a line where a notch is formed. It is required to choose a blade capable of effectively cutting silicon and a glass at the same time using general dicing equipments under an optimum dicing process condition.

Technology of COB and COF assemblies.

FIG. 13 shows a COB assembly process by reflowing solder on a flexible PCB substrate of an image sensor module where a solder ball 1102 is attached, and a COF assembly process using an anisotropic conductive film (ACF) of an image sensor module where a non solder bump 1103 is formed.

Referring to FIG. 13, a Chip-on-Board (COB) process using a solder ball for the second connection of a separate image sensor module and Chip-on-Film (COF) process using an adhesive joining are performed. The COB process is performed by reflowing solder between a solder ball formed on a lower electrode of a glass and a PCB substrate electrode. At this time, the PCB substrate is a substrate on which an image sensing area is formed and has an electrode structure where nickel of 1 μm and gold of 0.2 μm are formed on a copper wiring with a thickness of 18 μm.

The COF process is performed by a thermocomposition process using an anisotropic conductive film (ACF) between a gold stud bump formed on a glass lower electrode and an electrode of a flexible substrate on which an image sensing area is formed. The anisotropic conductive film ACF is the same used when COF bonding of the existing image sensor module is performed and their bonding conditions are the same.

The present invention has been described with reference to the preferred embodiments but it is apprehended that the present invention can be modified and changed within the spirit and scope described in the claims in various ways to those skilled in the art.

As described above, according to the present invention, it is possible to realize a cheap wafer level chip size package (WL-CSP) using the existing wafer processing and metal deposition processing equipments. An image sensor module with a thinner thickness and a smaller volume than the existing CSP package and a module with a much smaller volume than the existing COG package can be realized.

Moreover, it is possible to obtain a cheap and a highly reliable image sensor module package because the material and the number of processes are less than the existing WL-CSP. This image sensor module has an increasing effect of a technology in realizing an image sensor package and other thin and short sensor chips.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A CMOS image sensor module using a wafer level chip size package technology, comprising:
    an image sensor chip wafer having a partition of photosensitive polymer materials with a lattice structure at portions except an image sensing area and a non solder bump formed in the partition directly contacted on both sides by the photosensitive polymer material;
    a glass wafer having a top and bottom surface, wherein an IR filter coating layer; is located directly on the bottom surface a metal electrode is located directly on the top surface opposite to the IR filter coating layer; and a V-shaped notch formed through the IR filter coating layer and the glass wafer to the metal electrode.

2. The image sensor module of claim 1, wherein the non solder bump in the partition is at least the one selected from the group consisting of a gold plating bump, an electroless nickel/gold bump, a gold stud bump, a copper stud bump and a copper plated bump.

3. The image sensor module of claim 1, wherein the partition with a lattice structure is formed of photosensitive polymer materials such as polyimide or Benzocyclobutene.

4. The image sensor module of claim 3, wherein the height of a partition with a lattice structure is the same as or less than that of the non solder bump.

5. The image sensor module of claim 1, wherein the metal electrode includes more than one metal selected from the group consisting of Au, Pd, Pt, Ag, Al and Cu.

6. The image sensor module of claim 1, wherein the image sensor chip wafer and the glass wafer contact each other by flip-chip bonding which is formed of an anisotropic conductive film or a non-conducting film, an anisotropic conductive paste or a non-conducting paste.

7. The image sensor module of claim 1, wherein the glass wafer has further a metal wiring formed in the V-shaped notch so that it is possible to electrically connect the non solder bump of the image sensor chip wafer and the metal electrode of the glass wafer with a solder bump or a non solder bump on the metal wiring on the lower surface of the glass wafer by the metal wiring.

8. The image sensor module of claim 7, wherein a solder bump on the metal wiring on the lower surface of the glass wafer is more than one bump selected from the group consisting of Sn, SnAg, SnAgCu, SnAgBi, PbSn and In.

9. The image sensor module of claim 7, wherein a non solder bump on the metal wiring on the lower surface of the glass wafer is more than one bump selected from the group consisting of an electroless nickel/gold bump, a gold plating bump, a gold stud bump, a copper plating bump and a copper stud bump.

* * * * *